United States Patent
Morita et al.

(10) Patent No.: US 7,245,248 B2
(45) Date of Patent: Jul. 17, 2007

(54) A/D CONVERTER AND A MICROCONTROLLER INCLUDING THE SAME

(75) Inventors: Yuichiro Morita, Hitachi (JP); Kohei Sakurai, Hitachi (JP); Nobuyasu Kanekawa, Hitachi (JP); Masatoshi Hoshino, Tsuchiura (JP); Hiromichi Yamada, Hitachi (JP); Kotaro Shimamura, Hitachinaka (JP); Satoshi Tanaka, Tachikawa (JP); Naoki Yada, Tokorozawa (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/912,542

(22) Filed: Aug. 6, 2004

(65) Prior Publication Data
US 2005/0040978 A1 Feb. 24, 2005

(30) Foreign Application Priority Data
Aug. 8, 2003 (JP) .............................. 2003-206631

(51) Int. Cl.
*H03M 1/12* (2006.01)
(52) U.S. Cl. .................................................... 341/155
(58) Field of Classification Search ................ 341/155, 341/141, 164, 165, 160
See application file for complete search history.

(56) References Cited

U.S. PATENT DOCUMENTS

| | | | |
|---|---|---|---|
| 5,212,483 A * | 5/1993 | Wakimoto | 341/141 |
| 5,291,197 A * | 3/1994 | Abe | 341/141 |
| 5,302,952 A * | 4/1994 | Campbell et al. | 341/155 |
| 5,619,201 A * | 4/1997 | Imakura | 341/141 |
| 5,691,719 A * | 11/1997 | Wakimoto | 341/141 |
| 6,147,635 A * | 11/2000 | Barrenscheen et al. | 341/155 |
| 6,351,231 B1 * | 2/2002 | Price et al. | 341/155 |
| 6,356,220 B1 * | 3/2002 | Takatsu | 341/137 |
| 6,788,235 B1 * | 9/2004 | Barrenscheen et al. | 341/155 |
| 6,798,371 B1 * | 9/2004 | Potlapalli et al. | 341/155 |
| 7,126,522 B2 * | 10/2006 | Ogawa | 341/155 |

FOREIGN PATENT DOCUMENTS

JP 6-13902 A 1/1994

\* cited by examiner

*Primary Examiner*—Peguy JeanPierre
(74) *Attorney, Agent, or Firm*—McDermott Will & Emery LLP

(57) ABSTRACT

In an A/D converter and a microcontroller including the same, the number of selection patterns of analog input channels is increased for each A/D conversion and the A/D conversion is conducted using an A/D converter having only fundamental functions without imposing load onto a CPU. The A/D converter or a DMA transfer device includes an A/D conversion table including one or more entries. Each entry includes enable bits for setting whether or not an A/D conversion is executed for the respective analog input channels and a plurality of count number bits for setting a number of executions of the A/D conversion.

2 Claims, 12 Drawing Sheets

| ARB [2-0] | PRIORITY LEVEL |
|---|---|
| 000 | ADREQr > ADREQt > ADREQe |
| 001 | ADREQr > ADREQe > ADREQt |
| 010 | ADREQt > ADREQr > ADREQe |
| 011 | ADREQt > ADREQe > ADREQr |
| 100 | ADREQe > ADREQr > ADREQt |
| 101 | ADREQe > ADREQt > ADREQr |
| 110 | RESERVED |
| 111 | RESERVED |

FIG. 9

|  | CONVERSION ENABLE (7 BITS) | | | | | | | | NO. OF CONVERSIONS (3 BITS) | | |
| --- | --- | --- | --- | --- | --- | --- | --- | --- | --- | --- | --- |
|  | AE0 | AE1 | AE2 | AE3 | AE4 | AE5 | AE6 | AE7 | RE2 | RE1 | RE0 |
| ADENTr | 1 | 0 | 0 | 0 | 0 | 0 | 0 | 0 | 1 | 0 | 0 |
| ADENTt | 0 | 1 | 1 | 1 | 1 | 0 | 0 | 0 | 0 | 1 | 0 |
| ADENTe | 0 | 0 | 0 | 0 | 0 | 0 | 1 | 1 | 0 | 0 | 1 |

| | | | | | | | | |
|---|---|---|---|---|---|---|---|---|
| ADSTAR | – | – | – | ADF | – | – | – | ADEF |
| ADCTLR | – | – | – | ADST | – | CH[2-0] | | |

| | | | | | | | | |
|---|---|---|---|---|---|---|---|---|
| ADREQR | – | – | – | – | – | – | – | ADRQ |
| ADMODR | – | ADREr | ADREt | ADREe | – | ARB[2-0] | | |
| DMSTAR | – | – | – | – | – | DMEFr | DMEFt | DMEFe |
| DMINTR | – | – | – | – | – | DMIEr | DMIEt | DMIEe |
| DMARHr | ARr15 | ARr14 | ARr13 | ARr12 | ARr11 | ARr10 | ARr9 | ARr8 |
| DMARLr | ARr7 | ARr6 | ARr5 | ARr4 | ARr3 | ARr2 | ARr1 | ARr0 |
| DMARHt | ARt15 | ARt14 | ARt13 | ARt12 | ARt11 | ARt10 | ARt9 | ARt8 |
| DMARLt | ARt7 | ARt6 | ARt5 | ARt4 | ARt3 | ARt2 | ARt1 | ARt0 |
| DMARHe | ARe15 | ARe14 | ARe13 | ARe12 | ARe11 | ARe10 | ARe9 | ARe8 |
| DMARLe | ARe7 | ARe6 | ARe5 | ARe4 | ARe3 | ARe2 | ARe1 | ARe0 |

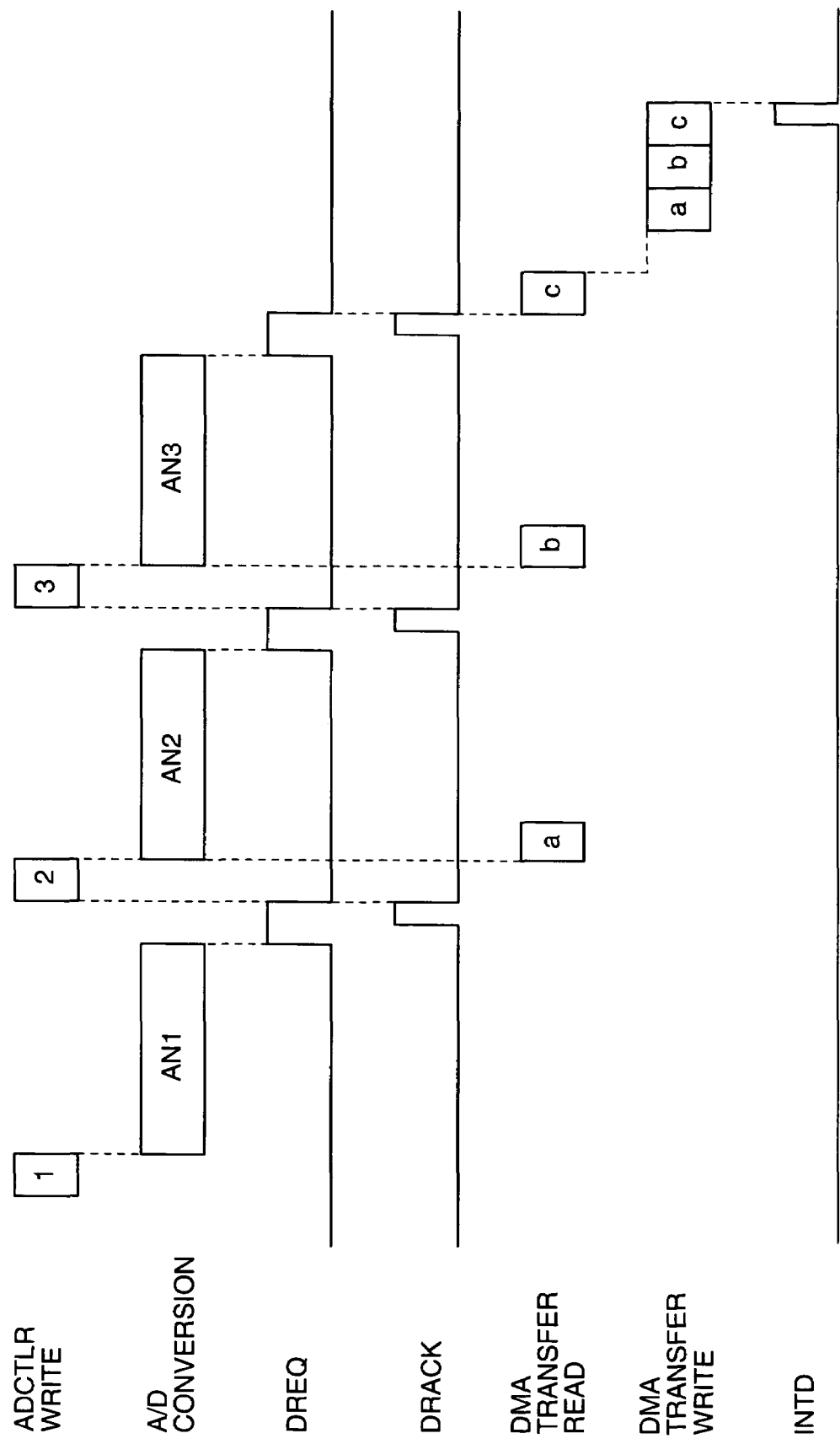

A/D CONVERTER AND A MICROCONTROLLER INCLUDING THE SAME

BACKGROUND OF THE INVENTION

The present invention relates to an analog-to-digital (A/D) converter for converting signals from a plurality input channels into digital signals, and in particular, to an A/D converter included in a microcontroller.

Due to development of the large scale integration (LSI) technology, microcontrollers today include various peripheral circuits integrated therein. Particularly, in microcontrollers adopted in a car control system, an A/D converter to conduct an analog-to-digital conversion for analog signals attained from a large number of sensors has become important.

In an A/D converter of the prior art, techniques have been devised to convert analog signals from a plurality of analog input channels into digital signals without imposing load onto a central processing unit (CPU).

For example, JP-A-6-149479 and JP-A-2002-314418 describe conventional techniques in which to set a selection pattern of analog input channels for an A/D conversion, an A/D conversion table is disposed to store therein a plurality of analog input channels. When an A/D conversion is initiated by, for example, a timer, each analog input channel is selected in an order set in the A/D conversion table to conduct the conversion.

JP-A-8-162953 describes a conventional technique of an A/D converter including a sequential A/D conversion mode to repeatedly conduct an A/D conversion for one or more analog input channels. To store a result of the conversion in a conversion result register, the A/D converter includes a conversion result transfer circuit.

The A/D converter is effective in that an A/D conversion is conducted for signals from a plurality of analog input channels without imposing load onto the CPU and the conversion results are stored in a predetermined location.

On the other hand, many systems such as a car control system increasingly require various functions and hence the CPU has a higher processing speed to execute many tasks. This leads to a tendency to increase the selection patterns of analog input channels in the A/D conversion. However, the prior art requires an A/D conversion table of large capacity to store therein a large number of analog input channel numbers each of which includes a plurality of bits. Therefore, a storage of large capacity is additionally required to integrally store a large number of A/D conversion tables. For example, when the number of analog input channels is $2^n$ and an analog input channel number includes n bits, an A/D conversion table to set therein the analog input channel numbers of $2^n$ channels requires $2^n \times n$ bits.

An A/D converter integrally installed in a microcontroller is applied to a plurality of microcontrollers for respectively different uses in many cases. There exists also a microcontroller in which a low cost thereof takes precedence over its functional variety. Therefore, an A/D converter having only fundamental functions is employed in this case. However, it is required in the prior art to dispose constituent elements such as A/D conversion tables and a conversion result transfer controller in the A/D converter. It is therefore difficult to share the A/D converter among various microcontrollers.

SUMMARY OF THE INVENTION

It is therefore an object of the present invention to provide an A/D converter and a microcontroller including the same in which the number of selection patterns of analog input channels is increased for each A/D conversion and the A/D conversion is conducted using an A/D converter having only fundamental functions without imposing load onto the CPU.

To achieve the object, there is provided according to the present invention an A/D converter including a plurality of analog input channels and an A/D conversion table including one or more entries. Each of the entries includes enable bits for setting whether or not an A/D conversion is executed for the respective analog input channels and a plurality of count number bits for setting a number of executions of the A/D conversion. When an A/D conversion is initiated, the A/D converter refers to one of the entries corresponding to the A/D conversion and repeatedly executes the A/D conversion for one of the analog input channels for which the enable bit is set in the entry as many times as indicted by the count number specified by the count number bits. Therefore, the number of combinations of analog input channels can be increased for each A/D conversion using storage capacity less than that required in the prior art. For example, in the prior art in which the number of analog input channels is $2^n$ and an analog input channel number is represented using n bits, an A/D conversion table to set therein the analog input channel numbers of $2^n$ channels requires $2^n \times n$ bits. In comparison therewith, in accordance with the present invention, one entry includes $2^n$ enable bits and n count bits, i.e., a total of $2^n + n$ bits. Therefore, the number of combinations of analog input channels is about n times that of the conventional A/D conversion table.

According to the present invention, there is provided an A/D converter including a plurality of analog input channels, a request selecting unit for selecting one A/D conversion request from a plurality of A/D conversion requests, and a priority setting unit for setting priority to a plurality of A/D conversion requests. When a plurality of A/D conversion requests are issued at the same time, the request selecting unit refers to the priority setting unit to select one A/D conversion request having higher priority from the A/D conversion requests. When a second A/D conversion request is issued during an execution of an A/D conversion for a first A/D conversion request, the request selecting unit refers to the priority setting unit. If the second A/D conversion request has higher priority than the first A/D conversion request, the request selecting unit selects the second A/D conversion request. As a result, the priority of the A/D conversion requests can be arbitrarily set.

According to the present invention, there is provided an A/D converter including a plurality of analog input channels, a request selecting unit for selecting one A/D conversion request from a plurality of A/D conversion requests, a priority setting unit for setting priority to a plurality of A/D conversion requests, a conversion control unit for controlling an A/D conversion, and an A/D conversion table including a plurality of entries for setting the analog input channels to be used for the respective A/D conversion requests. When a plurality of A/D conversion requests are issued at the same time, the request selecting unit refers to the priority setting means to select one A/D conversion request having higher priority from the A/D conversion requests. When a second A/D conversion request is issued during an execution of an A/D conversion for a first A/D conversion request, the request selecting unit refers to the priority setting unit. If the second A/D conversion request has higher priority than the first A/D conversion request, the request selecting unit selects the second A/D conversion request. The conversion control unit refers to the entry of the A/D conversion table corresponding to an A/D conversion request selected by the request selecting unit and thereby controls the A/D conversion. When the request selecting unit selects a second A/D conversion request during an execution of an A/D conversion for a first A/D conversion request, the conversion control unit temporarily saves an execution process of the A/D conversion to interrupt the A/D conversion and executes an A/D conversion for the second A/D conversion request. When the A/D conversion for the second A/D conversion request is finished, the conversion control unit restores the execution process saved before and resumes the A/D conversion for the first A/D conversion request. Consequently, during an execution of a first A/D conversion request, when a second A/D conversion to be conducted before the first A/D conversion request is issued, the second A/D conversion can be immediately conducted.

According to the present invention, there is provided a microcontroller including a memory, an analog-to-digital (A/D) converter including a plurality of analog input channels, and a direct memory access (DMA) transfer device for transferring a result of an A/D conversion from the A/D converter to the memory. The DMA transfer device includes an A/D conversion table for setting an analog input channel for an A/D conversion. When an A/D conversion is initiated, the DMA transfer device refers to the A/D conversion table to initiate an A/D conversion of the A/D converter. When the A/D conversion is finished, the DMA transfer device transfers a result of the conversion from the A/D converter to the memory. Therefore, a desired A/D conversion can be accomplished without imposing load onto the CPU by uses of an A/D converter including only fundamental functions.

In the microcontroller, the A/D converter includes a control register for setting an analog input channel for an A/D conversion and a DMA request signal for requesting the DMA transfer device to conduct a DMA transfer. The DMA transfer device sets the analog input channel to the control register of the A/D converter to thereby initiate an A/D conversion. When the A/D converter outputs the DMA request signal after the A/D conversion is finished, the DMA transfer starts a DMA transfer. Resultantly, the interface between the A/D converter and the DMA transfer device can be simplified.

Other objects, features and advantages of the invention will become apparent from the following description of the embodiments of the invention taken in conjunction with the accompanying drawings.

BRIEF DESCRIPTION OF THE DRAWINGS

FIG. 9 is a diagram showing a example of entries set in an A/D conversion table.

FIG. 11 is a diagram showing a format of a conversion control register.

FIG. 12 is a diagram showing a format of a transfer control register.

FIG. 15 is a signal timing chart showing an operation example of a DMA transfer device to conduct a DMA transfer of an A/D conversion result.

DESCRIPTION OF THE EMBODIMENTS

Referring now to FIGS. 1 to 9, description will be given of a first embodiment according to the present invention.

Figure 1:
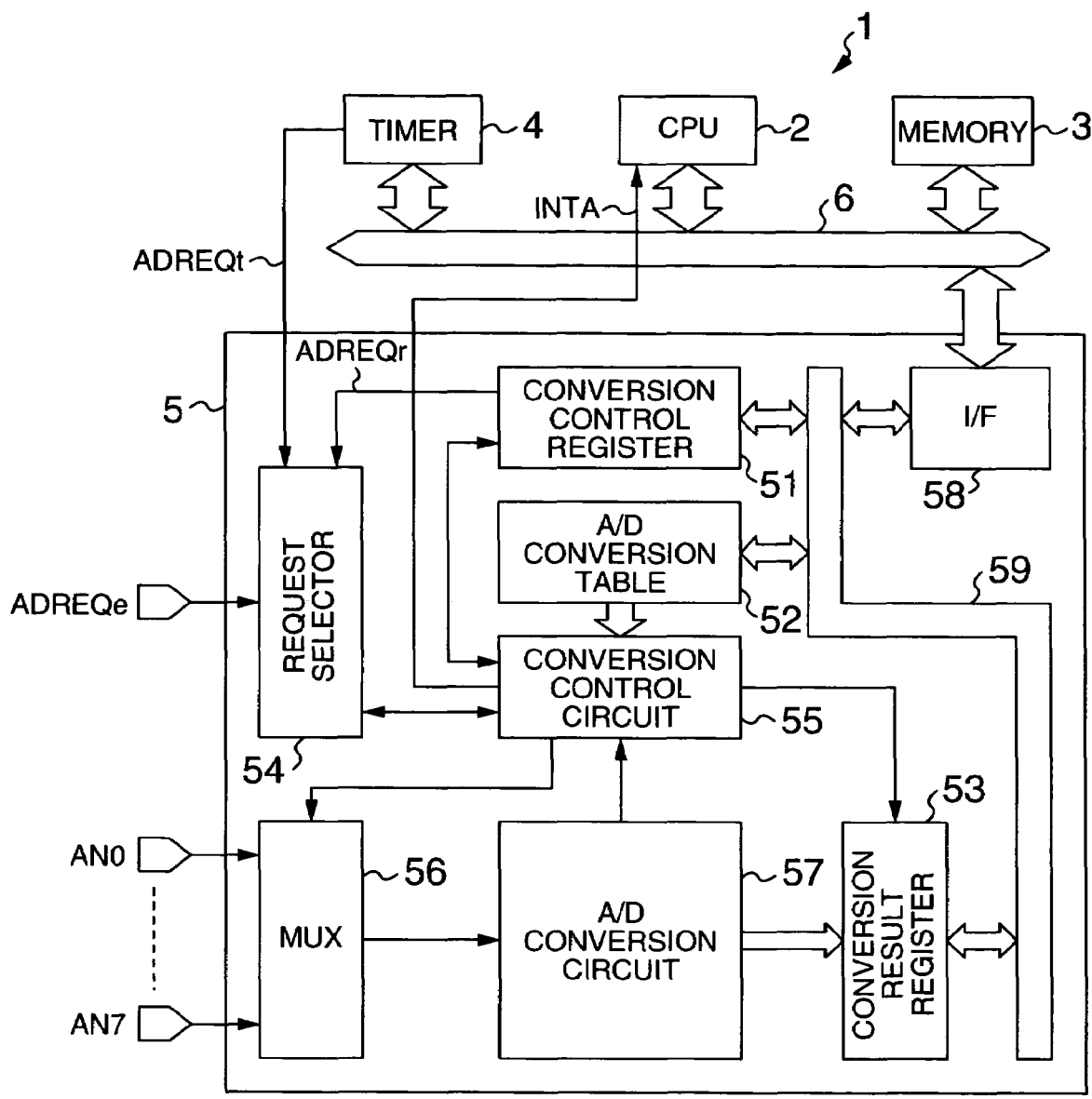
FIG. 1 is a circuit diagram showing an outline of a configuration of a computation processing system in a first embodiment.

FIG. 1 shows in a block diagram an outline of a configuration of a computation processing system in the first embodiment.

The processing system 1 includes a central processing unit (CPU) 2, a memory 3, a timer 4, an A/D converter 5, and a system bus 6 linking these constituent components to each other.

The CPU 2 can access via the system bus 6 the memory 3, the timer 4, and the A/D converter 5.

The memory 3 is a storage to store computation processing programs and data items. CPU 2 conducts reading and writing operations for the memory 3.

The timer 4 generates an A/D conversion request signal (ADREQt) at a predetermined interval of time. The CPU 2 sets the interval of time to the timer 4.

The A/D converter 5 is a device to convert an analog signal inputted from an external device into digital data. The converter 5 includes a conversion control register 51, an A/D conversion table 52, a conversion result register 53, a request selector circuit 54, a conversion control circuit 55, a multiplexer 56, an A/D conversion circuit 57, an interface circuit 58, seven analog input channels AN0 to AN7 in the form of external terminals, and an internal bus 59. The bus 59 couples the control register 51, the A/D conversion table 52, and the result register 53 with the interface 58. Although the analog input includes seven channels in the description of the embodiment, the present invention is applicable to a desired number of channels.

The CPU 2 can conduct reading and writing operations in the conversion control register 51. According to a writing operation by the CPU 2, the register 51 initiates an A/D conversion or displays a state or status of the A/D conversion.

In the A/D conversion table 52, an analog input channel to be selected for an A/D conversion and the count number of conversions are set according to each of the A/D conversion requests. The CPU 2 can achieve reading and writing operations in the table 52.

The conversion result register 53 is used to store a result of the A/D conversion.

The request selector circuit 54 selects either one of the A/D conversion request signal (ADREQt) from the timer 4, the A/D conversion request signal (ADREQr) produced when the CPU 2 writes a predetermined value in the conversion control register 51, and the A/D conversion requests (ADREQe) from the external terminal and outputs the request to the conversion control circuit 55. When a plurality of A/D conversion requests are issued, the circuit 54 selects one of the requests according to priority set to the conversion control register 51. It is also possible to inhibit selection of a particular A/D conversion according to the setting of the register 51.

When an A/D conversion request is received from the request selector 54, the conversion controller 55 controls the multiplexer 56, the A/D conversion circuit 57, and the conversion result register 53 such that an analog input channel is selected or one of the channels is sequentially selected in association with the request, and then an A/D conversion is conducted for the channel to store a result of the conversion at a particular address of the result register 53.

The multiplexer 56 selects from the analog input channels AN0 to AN7 one channel specified by the conversion controller 55 and outputs the channel to the A/D conversion circuit 57.

At timing indicated by the control circuit 55, the conversion circuit 57 converts a signal from the channel selected by the multiplexer 56 and outputs a resultant digital value to the result register 53.

The register 53 stores the conversion result from the conversion circuit 57 at an address thereof specified by the control circuit 55.

The interface 58 links the system bus 6 with the internal bus 59. The CPU 2 can access via the interface 58 the control register 51, the conversion table 52, and the result register 53.

Figures 2, 3:
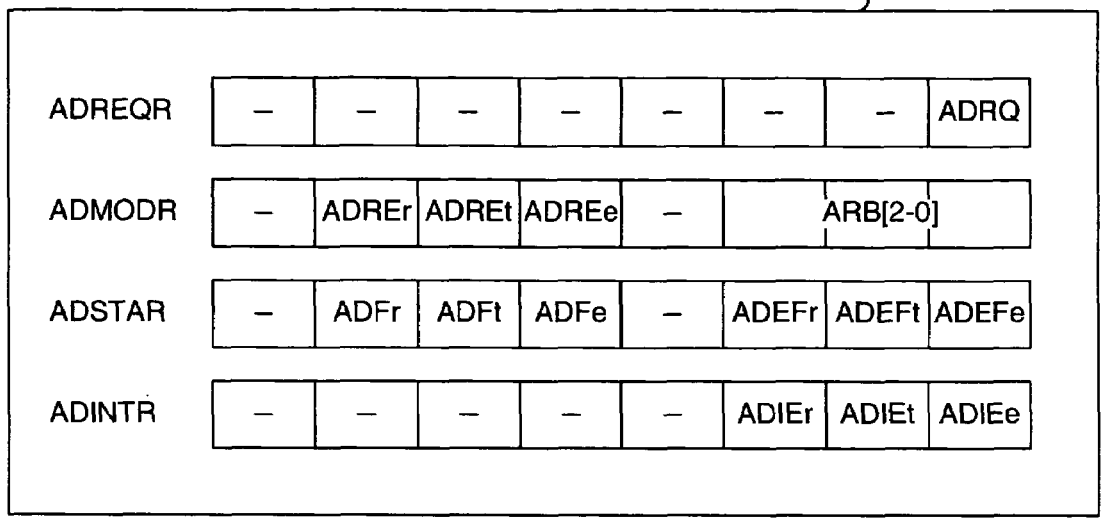
FIG. 2 is a diagram showing a format of a conversion control register.
FIG. 3 is a diagram showing priority of A/D conversion requests, the priority being indicated by the values of ARB[2-0].

FIG. 2 shows a format of the conversion control register 51.

The register 51 includes an A/D conversion request register (ADREQR), an A/D conversion mode register (ADMODR), an A/D conversion status register (ADSTAR), and an A/D conversion interruption register (ADINTR).

The A/D conversion request register (ADREQR) includes an A/D request bit (ADRQ) for the CPU 2 to request an A/D conversion. When the CPU 2 sets ADRQ, the register ADREQR sends an A/D conversion request signal (ADREQr) to the request selector circuit 54. When the selector 54 selects the request, ADRQ is cleared.

The A/D conversion mode register (ADMODR) includes three A/D conversion enable bits (ADREr, ADREt, and ADREe) to select whether the respective A/D conversion requests are set to an effective or ineffective state and a three-bit A/D conversion priority selector (ARB[2-0]) to set priority of each A/D conversion request.

The enable bits (ADREr, ADREt, and ADREe) correspond respectively to the request signal ADREQr inputted to the selector 54 when the CPU 2 sets ADRQ, the request signal ADREQt inputted from the timer 4 to the selector 54, and the request signal ADREQe inputted from an external device to the selector 54. When any one of the enable bits is set, the selector 54 regards an A/D conversion request signal corresponding to the enable bit as effective and assumes the signal to be selected. When any one of the enable bits is cleared, the selector 54 regards an A/D conversion request signal corresponding to the enable bit as ineffective and assumes the signal not to be selected.

By setting a value ranging from 000 to 101 to the A/D conversion priority selector ARB[2-0], priority is determined for the A/D conversion requests ADREQr, ADREQt, and ADREQe. FIG. 3 shows a priority order for the A/D conversion requests associated with the values of ARB[2-0].

The A/D conversion status register (ADSTAR) includes three A/D conversion execution flags ADFr, ADFt, and ADFe indicating that the A/D conversion is being executed and three A/D conversion end flags ADEFr, ADEFt, and ADEFe indicating that the A/D conversion is finished.

The A/D conversion execution flags ADFr, ADFt, and ADFe correspond respectively to the A/D conversions of the A/D conversion requests of ADREQr, ADREQt, and ADREQe, respectively. When the A/D conversion is started, the associated one of the A/D conversion execution flags is set. When the conversion is finished, the flag is cleared.

The A/D conversion end flags ADEFr, ADEFt, and ADEFe correspond respectively to the A/D conversions of the conversion requests of ADREQr, ADREQt, and ADREQe, respectively. When the A/D conversion is finished, the associated one of the A/D conversion end flags is set. The flag is cleared when the CPU 2 writes predetermined data therein.

The A/D conversion interruption register (ADINTR) includes three A/D interruption enable bits ADIEr, ADIEt, and ADIEe. Each of the bits is used to select whether or not an interruption signal (INTA) is outputted to the CPU 2 when the A/D conversion is completely finished for an associated A/D conversion request.

The A/D interruption enable bits ADIEr, ADIEt, and ADIEe correspond respectively to the A/D conversions executed by the A/D conversion requests of ADREQr, ADREQt, and ADREQe, respectively. When any one of the enable bits is set, the conversion control circuit 55 interrupts the CPU 2 after the associated A/D conversion is finished. When the bit is cleared, the controller 55 does not interrupt the CPU 2 after the conversion is finished.

Figure 4:
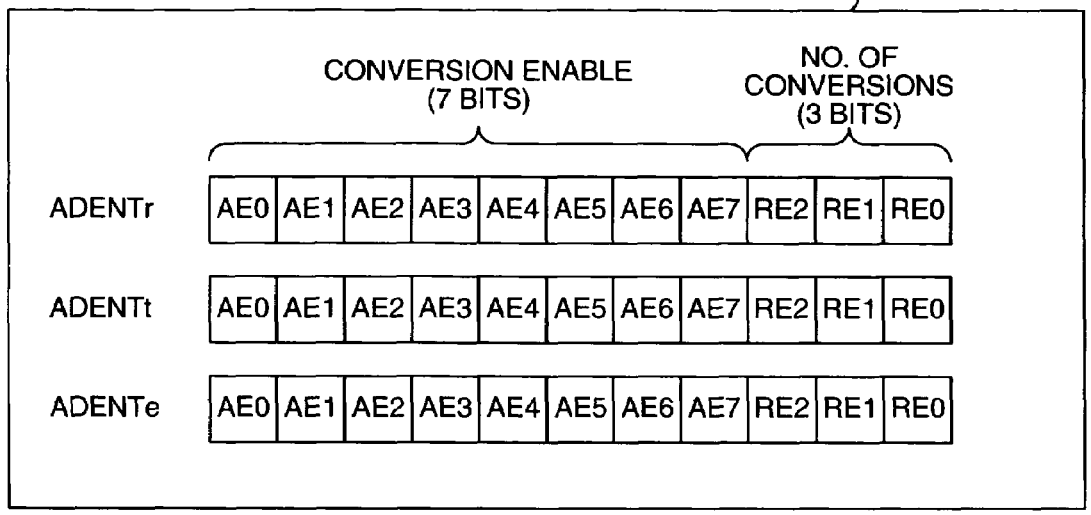
FIG. 4 is a diagram showing a format of an A/D conversion table.

FIG. 4 shows a format of the A/D conversion table 52.

The table 52 includes three entries ADENTr, ADENTt, and ADENTe. The entries respectively correspond to an A/D conversion caused by a write operation in the A/D conversion control register (ADCTLR), an A/D conversion of an A/D conversion request by the timer 4, and an A/D conversion of an A/D conversion request by the external terminal TRG.

Each entry of the table 52 includes eight conversion enable bits AE0 to AE7 respectively corresponding to the seven analog input channels and three conversion count bits (RE[2-0]).

The conversion enable bits AE0 to AE7 are used to indicate whether or not the A/D conversions are executed for the analog inputs AN0 to AN7, respectively. The conversion controller 55 reads an entry corresponding to the A/D conversion request selected by the request selector circuit 54. While making a search for the bits AE0 to AE7 in this order, the controller 55 sequentially conducts the A/D conversion for the analog input of which the conversion enable bit is set.

The conversion count bits (RE[2-0]) are used to set the iteration count to repeatedly conduct the A/D conversion for the analog input for which the conversion enable bit is set. While making a search for the bits AE0 to AE7 in this order, the controller 55 repeatedly conducts the A/D conversion as indicated by RE[2-0] for the analog input of which the conversion enable bit is set.

Figure 5:
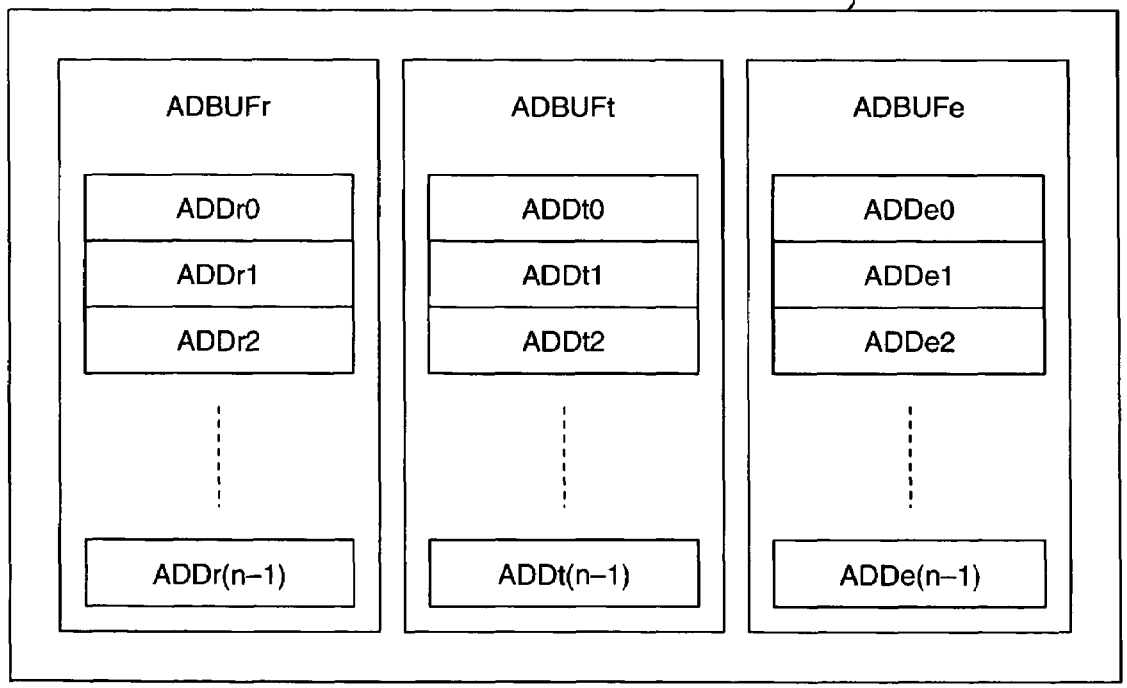
FIG. 5 is a diagram showing a format of a conversion result register.

FIG. 5 shows a format of the conversion result register 53.

The register 53 includes three result data buffers ADBUFr, ADBUFt, and ADBUFe. Each buffer includes N result registers ADDx0 to ADDX(N−1). The buffers ADBUFr, ADBUFt, and ADBUFe correspond respectively to the A/D conversions by the A/D conversion requests respectively indicated by the A/D conversion request signal ADREQr inputted to the request selector 54 when the CPU 2 sets ADRQ, the A/D conversion request signal ADREQt inputted from the timer 4 to the request selector 54, and the A/D conversion request signal ADREQe inputted from the external terminal to the request selector 54. The buffers store results of the A/D conversions associated with the respective A/D conversion requests. The result registers to store digital data are ordered as ADDx0, ADDx1, ADDx2, and so on regardless of the analog input channel numbers. When an A/D conversion is initiated again, digital data is stored in the registers beginning at ADDx0.

Figure 6:
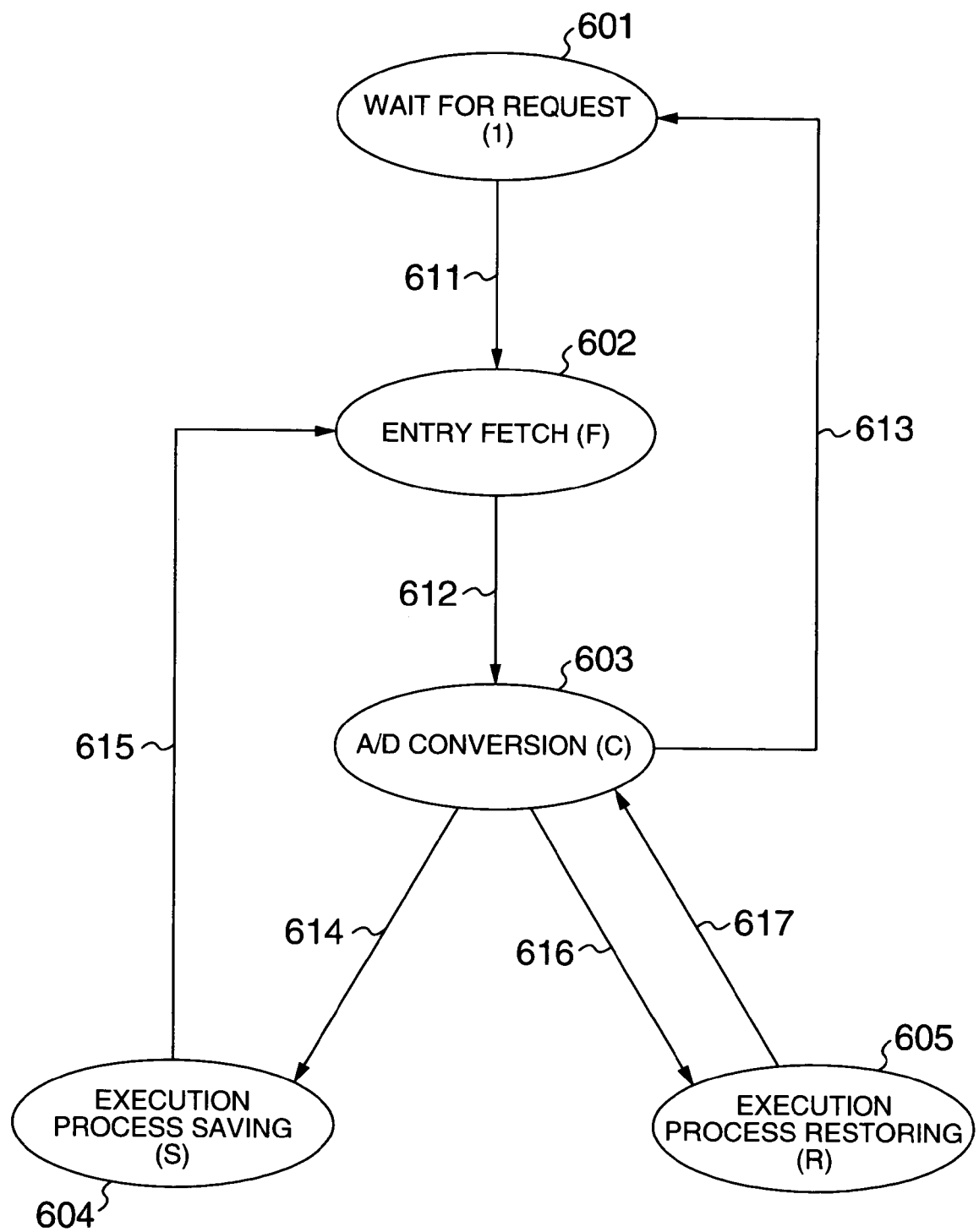
FIG. 6 is a flow diagram showing state transitions for a conversion control circuit to control an operation to refer to an A/D conversion table.

FIG. 6 is a state transition diagram for the conversion control circuit 55 to control an operation to refer to the A/D conversion table 52.

"Wait for request" 601 indicates a state in which the system does not conduct any A/D conversion and waits for an A/D conversion request.

"Entry fetch" 602 designates a state in which the system has received an A/D conversion request and is reading an entry from the conversion table 52 according to the request.

"A/D conversion" 603 indicates a state in which the system is conducting an A/D conversion according to the entry obtained from the table 52.

"Execution process saving" 604 designates a state in which the system is saving an execution process of an A/D conversion in execution in a buffer or a first-in-first-out (FIFO) storage, not shown.

"Execution process restoring" 605 indicates a state in which the system restores the execution process saved in the state 604 in the buffer or FIFO storage, not shown.

The conversion control circuit 55 is first in the request wait state 601. When an A/D conversion request is received from the request selector circuit 54, the circuit 55 changes into the entry fetch state 602 (611) and reads an associated entry from the A/D conversion table 52. Thereafter, the circuit 55 changes to the A/D conversion state (612) to execute an A/D conversion. When there does not appear any A/D conversion request higher in priority than the A/D conversion request in execution and the A/D conversion of the pertinent A/D conversion request is finished and if any execution process of an A/D conversion is not saved in the buffer or FIFO storage, the conversion control circuit 55 changes to the request wait state 601 (613).

In the A/D conversion state 603, when an A/D conversion request having higher priority than the A/D conversion request in process is issued, the conversion controller 55 changes to the execution process saving state 604 (614). In this state, the controller 55 stores in the buffer or FIFO storage an execution process (i.e., an analog input channel for which the A/D conversion is finished and the number of A/D conversions conducted). The controller 55 then changes to the entry fetch state 602 to conduct the A/D conversion for the request having higher priority (615).

In a situation in which the A/D conversion is executed in the A/D conversion state 603 and the A/D conversion in process is finished without receiving any other A/D conversion request having higher priority during the execution of the A/V conversion request, if an execution process has been saved in the buffer or the FIFO storage, the conversion controller 55 changes to the execution process restoring state 605 (616). In this state, the controller 55 restores the execution process from the buffer or the FIFO storage and then changes to the A/D conversion state 603 (617) to resume the A/D conversion interrupted before.

As a result, the conversion controller 55 saves a plurality of execution processes in the buffer or the FIFO storage without setting an A/D conversion request having higher priority to a wait state. The controller 55 also guarantees execution of the A/D conversions having lower priority.

Figure 7:
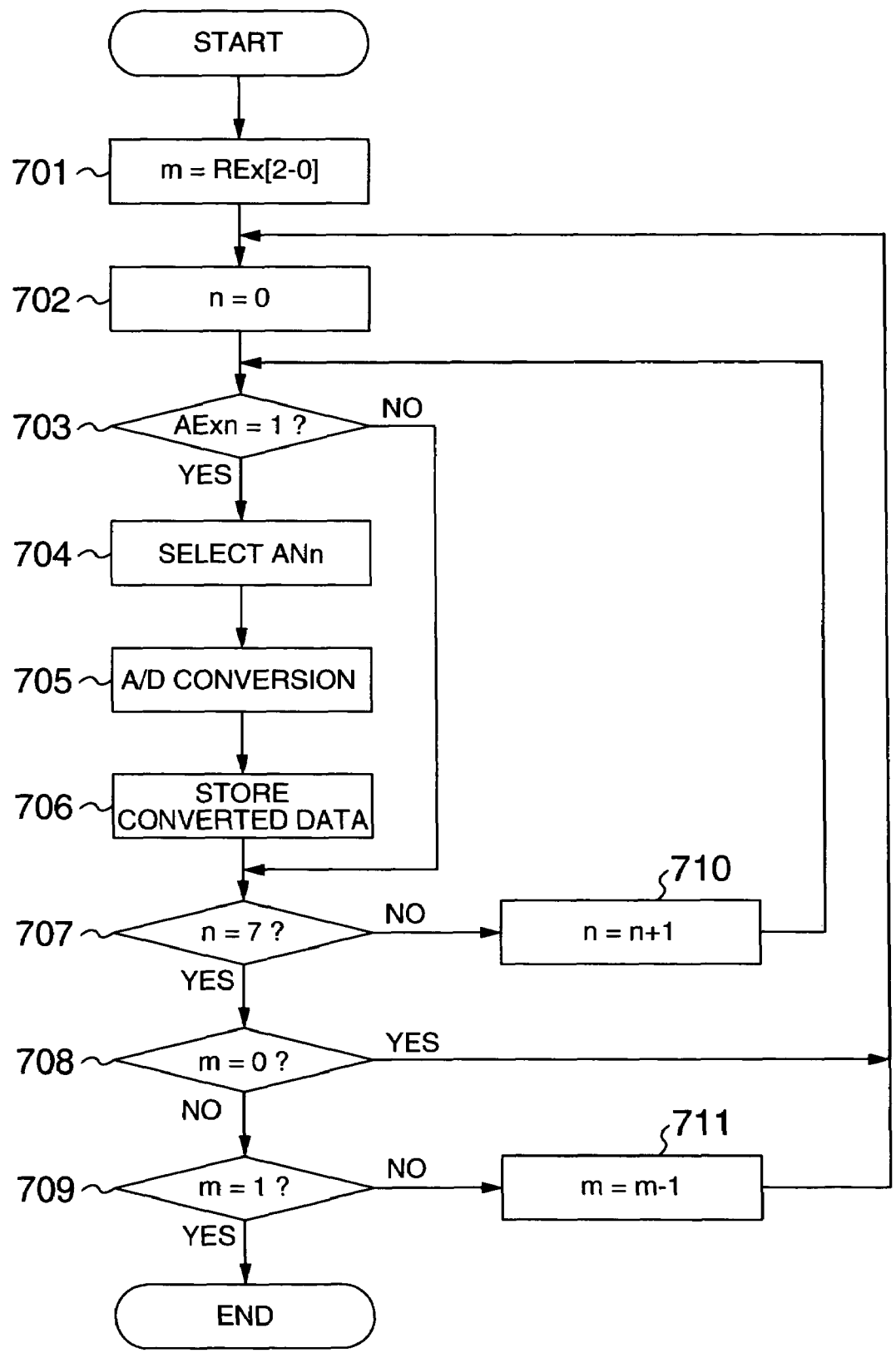
FIG. 7 is a flowchart showing an A/D conversion control of the conversion control circuit.

FIG. 7 shows in a flowchart an operation of the conversion control circuit 55 to control an A/D conversion.

Having received an A/D conversion request, the controller 55 reads an associated entry from the conversion table to control the A/D conversion as follows.

First, the controller 55 substitutes the value of the conversion count RE[2-0] for variable m (701) and then 0 for variable n (702).

Next, the controller 55 makes a check to determine whether or not one has already been set to AEn (703). If this is the case, the controller 55 drives the multiplexer 56 to select an analog input channel ANn (704) such that the A/D conversion circuit 57 conducts an A/D conversion for a signal from the selected channel (705) and a result of the conversion is stored in the conversion result register 53 (706). If one has not been set to AEn, the control operation is cancelled.

The controller 55 then makes a check to determine whether or not n is 7, namely, if the last AE is to be processed (707). If n is other than seven, the controller 55 adds one to n (710) to attempt an A/D conversion for the subsequent analog input channel ANn. If n is seven, the controller 55 assumes that the desired A/D conversion has been finished for the analog inputs AN0 to AN7 and makes a check to determine whether or not the A/D conversion is to be again executed.

In the check, it is confirmed whether or not variable m is 0 (708). If m is 0, i.e., RE[2-0] is 0, the controller 55 assumes that the A/D conversion is infinitely conducted and returns to step 702. If m is other than 0, the controller 55 makes a check to determine whether or not the count number of A/D conversions specified by RE[2-0] is reached. When the A/D conversion is executed for the analog inputs AN0 to AN7, one is subtracted from variable m. Therefore, the condition above can be judged according to whether or not variable m is one. If this is the case, the controller 55 terminates the A/D conversion; otherwise, the controller 55 returns to step 702.

The control can be conducted at a higher speed through a pipeline operation using hardware of circuits such as a logic circuit.

Figure 8:
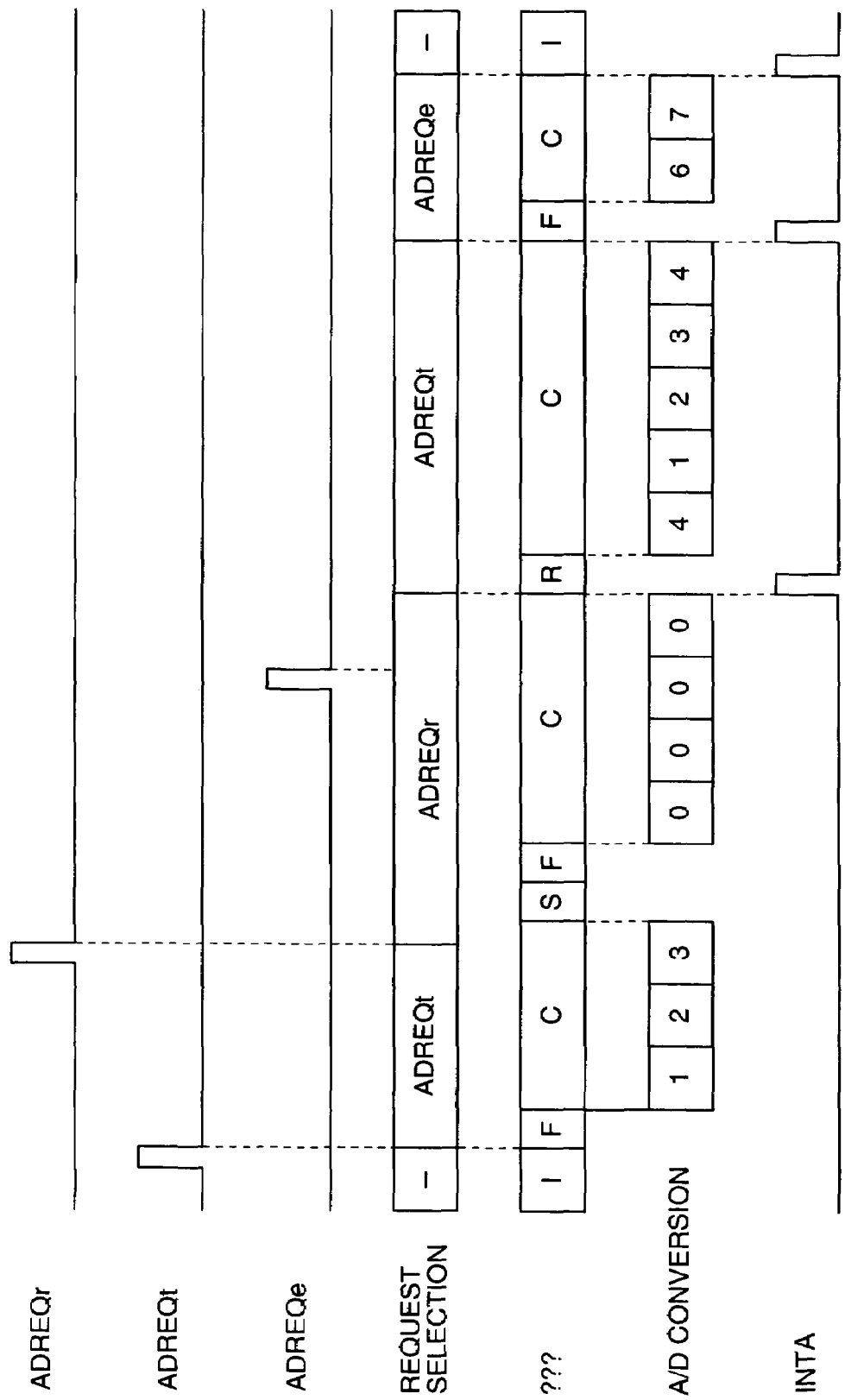
FIG. 8 is a signal timing chart showing an example of operation of the conversion control circuit.

FIG. 8 shows an operation example of the A/D converter 5 in a signal timing chart.

In the chart, ADREQr indicates an A/D conversion request issued when the CPU 2 sets ADREQ, ADREQt is an A/D conversion request from the timer 4, ADREQe designates an A/D conversion request from the external terminal. "Request Selection" indicates an A/D conversion request issued from the request selector circuit 54 to the conversion controller 55. "Control State" is a state or status in which the controller 55 refers to the conversion table and indicates one of the states corresponding to its values as I=Request wait state, F=Entry fetch state, C=A/D conversion state, S=Execution process saving state, and R=Execution process restoring state. "A/D Conversion" designates an analog input channel number for the A/D conversion. INTA indicates an interruption signal outputted from the conversion controller 55 to the CPU 2.

Assume that the A/D conversion table 52 includes entries of ADREQr, ADREQt, and ADREQe as shown in FIG. 2.

Assume also that the conversion control register 51 includes ADMODR in which "1" is set to each of ADREr, ADREt, and ADREe and "000" is set to ARB[2-0]. This means that three A/D conversion requests are effective and priority is set in an order of ADREQr, ADREQt, and ADREQe.

When ADREQt is received from the timer 4, the request selector circuit 54 outputs an A/D conversion request ADREQt to the conversion control circuit 55. The controller 55 changes to the entry fetch state to read an entry ADENTr and then changes to the A/D conversion state to sequentially conduct an A/D conversion for an analog input to which a conversion enable bit is set.

During the A/D conversion, if ADREQr having higher priority is received, the request selector 54 outputs the A/D conversion request ADREQr to the conversion controller 55. The controller 55 changes to the execution process saving state to save, in the buffer or the FIFO storage, information indicating that the conversion has been finished up to the analog input channel 3 in the first operation. Thereafter, the controller 55 changes to the entry fetch state to obtain ADENTr and then changes to the A/D conversion state to sequentially conduct an A/D conversion for an analog input to which a conversion enable bit is set.

During the A/D conversion, if ADREQe having lower priority is received, the request selector 54 keeps the request therein. When other A/D conversions having higher priority are finished, the request selector 54 outputs the ADREQe to the conversion controller 55.

When the A/D conversion is finished for the entry ADENTr, the conversion controller 55 notifies the conversion completion to the request selector 54 and outputs INTA to the CPU 2. Having received the notification, the request selector 54 outputs to the conversion controller 55 again the entry ADREQt beforehand outputted.

The controller 55 changes to the execution process restoring state to restore the execution process of the A/D conversion for the entry ADREQt. The controller 55 changes to the A/D conversion state to resume the A/D conversion for the entry ADREQt.

When the A/D conversion is finished for the entry ADREQt, the conversion controller 55 reports a notification of the conversion completion to the request selector 54 and outputs again INTA to the CPU 2. When the notification is received, the request selector 54 outputs to the conversion controller 55 the ADREQe beforehand inputted.

The conversion controller 55 changes to the entry fetch state to obtain an entry ADENTe. The controller 55 changes to the A/D conversion state to sequentially conduct an A/D conversion for an analog input to which a conversion enable bit is set.

When A/D conversion is finished for the entry ADENTe, the conversion controller 55 reports a notification of the conversion completion to the request selector 54 and outputs again INTA to the CPU 2, and then changes to the wait state.

In the description of the first embodiment, the number of A/D conversion requests is three and the A/D conversion table 52 includes three entries. However, it is also possible that each of the numbers respectively of A/D conversion requests and the entries of the table 52 is at most two or at least four. Although the number of analog input channels are seven in the description, the number of analog input channels may also be at most six or at least eight.

Referring now to FIGS. 10 to 16, description will be given of a second embodiment according to the present invention.

Figure 10:
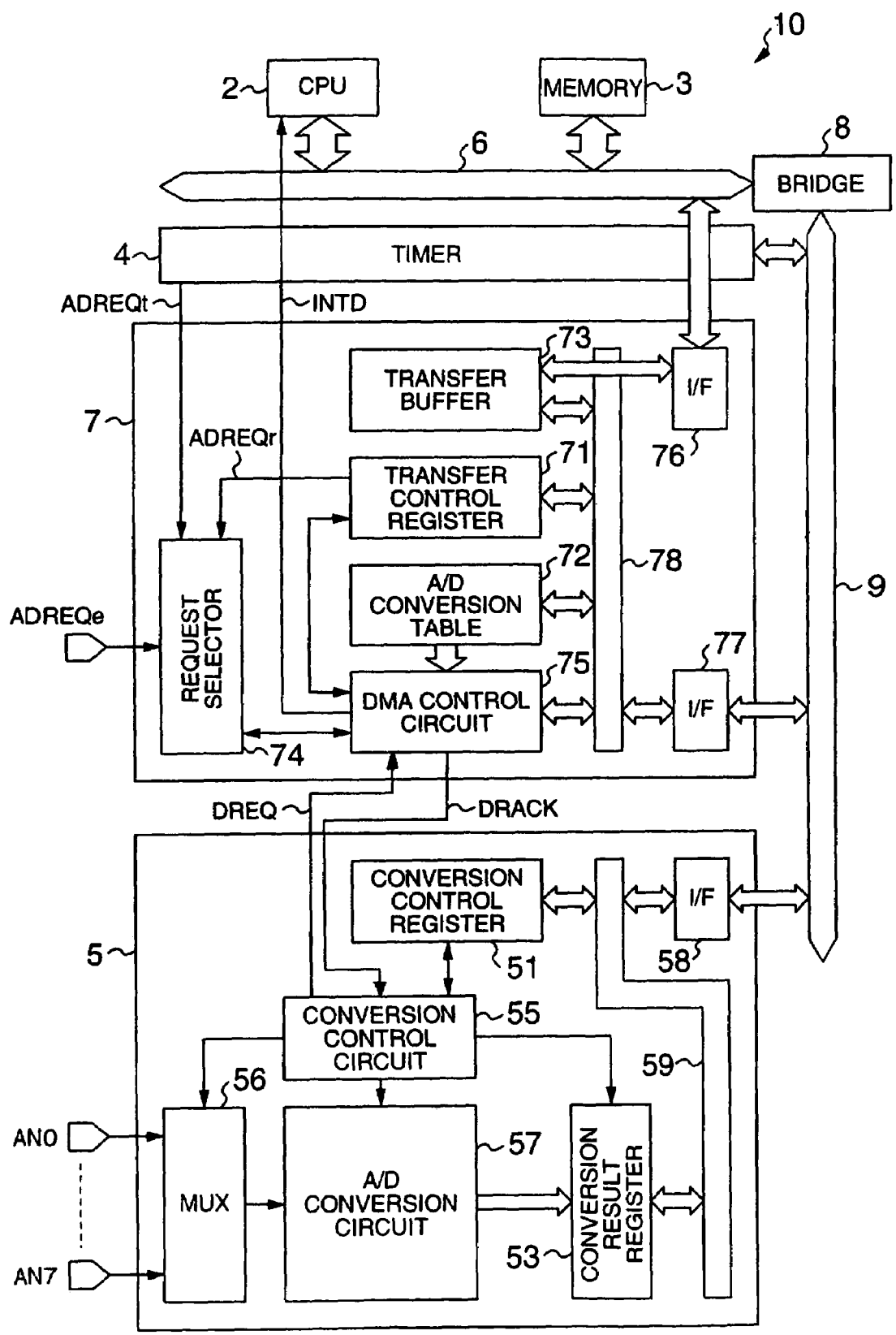
FIG. 10 is a circuit diagram showing an outline of a configuration of a computation processing system in a second embodiment.

FIG. 10 shows in a circuit diagram an outline of a configuration of a computation processing system in the second embodiment.

The system 10 includes a CPU 2, a memory 3, a timer 4, and an A/D converter 5, a DMA transfer device 7, and a bus bridge 8. The timer 4, the A/D converter 5, and the DMA transfer device 7 are connected to a system bus 6. The timer 4, the A/D converter 5, and the DMA transfer device 7 are connected to a peripheral bus 9. The bridge 8 connects the system bus 6 to the peripheral bus 7. The system bus 6 has a high transfer speed so that the CPU 2 and the DMA transfer device 7 access the memory 3 in a short period of time. To connect many peripheral modules to the peripheral bus 9, the bus 9 has a lower transfer speed than the system bus 6. It is also possible that the peripheral bus 9 is equal in the transfer speed to the system bus 6. In place of the buses 6 and 9, switch circuits may be arranged.

The CPU 2 accesses the memory 3 via the system bus 6. The CPU 2 also accesses the timer 4, A/D converter 5, and the DMA transfer device 7 via the system bus 6, the bus bridge 8, and the peripheral bus 9.

The memory 3 is a storage to store computation processing programs and data items. The CPU 2 conducts reading and writing operations for the memory 3. The DMA transfer device 7 writes data in the memory 3.

The timer 4 generates an A/D conversion request signal (ADREQt) at a predetermined interval of time. The CPU 2 sets the interval of time to the timer 4.

The A/D converter 5 is a device to convert an analog signal inputted from an external device into digital data. The converter 5 includes a conversion control register 51, a conversion result register 53, a conversion control circuit 55, a multiplexer 56, an A/D conversion circuit 57, an interface circuit 58, eight analog input channels AN0-AN7 in the form of external terminals, and an internal bus 59. The bus 59 couples the control register 51 and the result register 53 via the internal bus 59 with the interface 58. Although the analog input includes seven channels in the description of the embodiment, the present invention is applicable to a desired number of channels.

The conversion control register 51 is used to initiate an A/D conversion and to indicate a state of the A/D conversion. The CPU 2 and the DMA transfer device 7 can conduct reading and writing operations for the register 51. By writing a predetermined value in the register, the CPU 2 and the DMA transfer device 7 can initiate an A/D conversion.

The conversion result register 53 is used to store a result of the conversion result.

When an A/D conversion is initiated in response to a writing operation of a predetermined value in the control register 51 by the CPU 2 or the DMA transfer device 7, the conversion controller 55 selects an analog input channel set to the register 51 to execute the A/D conversion. The controller 55 then controls the multiplexer 56, the A/D converter 57, and the conversion result register 53 to store a result of the conversion at a predetermined address of the register 53. When the A/D conversion is finished, the controller 55 outputs a DMA transfer request signal (DREQ) to the DMA transfer device 7. When a DMA request reception signal (DRACK) is received from the transfer device 7, the controller 55 stops the output of DREQ.

The multiplexer 56 selects from the analog input channels AN0 to AN7 one channel specified by the conversion controller 55 and outputs the channel to the A/D conversion circuit 57.

At timing indicated by the control circuit 55, the conversion circuit 57 converts a signal from the channel selected by the multiplexer 56 and outputs a resultant digital value to the result register 53.

The register 53 stores therein the conversion result from the conversion circuit 57 at an address thereof specified by the control circuit 55.

The interface 58 links the peripheral bus 9 with the internal bus 59. The CPU 2 and the DMA transfer device 7 can access via the interface 58 the control register 51 and the result register 53.

The DMA transfer device 7 is used to transfer an A/D conversion result from the A/D converter 5 to the memory 3. The device 7 includes a transfer control register 71, an A/D conversion table 72, a transfer data buffer 73, a request selector circuit 74, a DMA control circuit 75, a system bus interface circuit 76, and a peripheral bus interface circuit 77. The transfer control register 71, the A/D conversion table 72, and the transfer data buffer 73 are connected via the internal bus 78 to the peripheral bus interface circuit 77. The transfer data buffer 73 is also coupled with the system bus interface circuit 76.

In general, a direct data transfer from a peripheral device such as the A/D converter 5 to a storage such as the memory 3 is called a dynamic memory access (DMA) transfer. Since the DMA transfer does not use the CPU, the processing load on the CPU is reduced.

The transfer control register 71 is used to set information necessary to control the DMA transfer. The register 71 is also used to indicate a state of the DMA transfer and to request an A/D conversion. The CPU 2 can conduct reading and writing operations in the register 71. By writing a predetermined value in the register 71, the CPU2 can output an A/D conversion request signal (ADREQr).

In the A/D conversion table 72, an analog input channel to be selected for an A/D conversion and the number of conversions are set in association with each of the A/D conversion requests. The CPU 2 can achieve reading and writing operations in the table 52.

The transfer data buffer 73 is a buffer to temporarily store a conversion result when the conversion result is transferred from the result register 53 of the A/D converter 5 to the memory 3.

The request selector circuit 74 selects either one of the A/D conversion request signal (ADREQt) from the timer 4, the A/D conversion request signal (ADREQr) produced when the CPU 2 writes a predetermined value in the conversion control register 71, the A/D conversion request signal (ADREQe) from the external terminal and outputs the request to the conversion control circuit 75. When a plurality of A/D conversion requests are issued, the circuit 74 selects one of the requests according to priority set to the conversion control register 71. It is also possible that a particular A/D conversion request is not selected according to the setting of the register 71.

When an A/D conversion request is issued from the request selector 74, the DMA controller 75 refers to the A/D conversion table 72 to sequentially request the A/D converter 5 to conduct an A/D conversion for an analog input channel corresponding to the A/D conversion request. When the A/D conversion is finished, the DMA controller 75 reads a conversion result from the result register 53 and transfers the result to the memory 3. Control of the operation to refer to the A/D conversion table 72 is substantially equal to that of the A/D control circuit 55 of the first embodiment described by referring to FIG. 6.

The DMA controller 75 initiates an A/D conversion by writing an analog input channel number in the conversion control register 51 of the A/D converter 5.

When DREQ is received from the conversion controller 55 of the A/D converter, the DMA controller 75 outputs DRACK to start a DMA transfer of conversion data.

FIG. 11 shows a format of the conversion control register 51.

The register 51 includes an A/D conversion status register ADSTAR and an A/D conversion control register ADCTLR.

The A/D conversion status register ADSTAR includes an A/D conversion execution flag ADF indicating that an A/D conversion is in process and an A/D conversion end flag ADEF indicating that the A/D conversion is finished.

The A/D conversion execution flag ADF is set when an A/D conversion is started and is cleared when the A/D conversion is finished.

The A/D conversion end flag ADEF is set when an A/D conversion is finished and is cleared when the CPU 2 writes predetermined data therein or when the DMA control circuit 75 outputs DRACK.

The A/D conversion control register ADCTLR includes an A/D start bit ADST and three channel selector bits CH[2-0]. These bits are used by the CPU 2 or the DMA control circuit 75 to initiate an A/D conversion. When the CPU 2 or the DMA control circuit 75 sets ADST, an A/D conversion is started. When the conversion is finished, ADST is cleared.

FIG. 12 shows a format of the transfer control register 71.

The register 71 includes an A/D conversion request register ADREQR, an A/D conversion mode register ADMODR, a DMA status register DMSTAR, a DMA interrupt register DMINTR, and DMA transfer destination address registers DMARHr, DMARLr, DMARHt, DMARLt, DMARHe, and DMARLe.

The A/D conversion request register ADREQR includes an A/D request bit ADRQ for the CPU 2 to request an A/D conversion. When the CPU 2 sets ADRQ, an A/D conversion request signal ADREQr is outputted to the request selector circuit 74. When the selector 74 selects the request, ADRQ is cleared.

The A/D conversion mode register ADMODR includes three A/D conversion request enable bits ADREr, ADREt, and ADREe to select whether each of the associated A/D conversion requests is set to an effective state or an ineffective state and three A/D conversion priority selector bits ARB[2-0] to set priority to each A/D conversion request.

The enable bits (ADREr, ADREt, and ADREe) correspond respectively to the request signal ADREQr inputted to the selector 74 when the CPU 2 sets ADRQ, the request signal ADREQt inputted from the timer 4 to the selector 74, and the request signal ADREQe inputted from an external device to the selector 74. When any one of the enable bits is set, the selector 74 regards an A/D conversion request signal corresponding to the enable bit as effective and assumes the signal to be selected. When any one of the enable bits is cleared, the selector 74 regards an A/D conversion request signal corresponding to the enable bit as ineffective and assumes the signal not to be selected.

By setting a value ranging from 000 to 101 to the A/D conversion priority selector (ARB[2-0]), priority is selected for the A/D conversion requests ADREQr, ADREQt, and ADREQe. FIG. 3 shows a priority order for the A/D conversion requests associated with the values of ARB[2-0].

The DMA status register DMSTAR includes three DMA end flags DMEFr, DMEFt, and DMEFe each of which indicates an end of a DMA transfer.

The DMA end flags DMEFr, DMEFt, and DMEFe correspond respectively to A/D conversion requests and DMA transfers respectively associated with A/D conversion requests corresponding to with ADREQr, ADREQt, and ADREQe, respectively. When the A/D conversion and the DMA transfer is finished, the associated DMA end flag is set. The each of the flags is cleared, when the CPU 2 writes predetermined data in the flag.

The DMA interrupt register (DMINTR) includes three DMA interrupt enable bits DMIEr, DMIEt, and DMIEe. Each of the bits is used to select whether or not an interruption signal INTD is outputted to the CPU 2 when the A/D conversion and the DMA transfer are completely finished for an associated A/D conversion request.

The DMA interrupt enable bits DMIEr, DMIEt, and DMIEe correspond respectively to A/D conversion requests and DMA transfers respectively corresponding to A/D conversion requests associated with ADREQr, ADREQt, and ADREQe, respectively. When the A/D conversion and the DMA transfer is finished, the associated the DMA controller 75 outputs an interruption signal INTD if an interrupt enable bit corresponding thereto is set. If the associated enable bit is cleared, the controller 75 does not output the interruption signal INTD when the A/D conversion and the DMA transfer is finished.

The DMA transfer destination address registers DMARHr and DMARLr correspond to the A/D conversion and the DMA transfer by ADREQr. The registers DMARHr and DMARLr are used to set therein a first address to transfer A/D conversion data to the memory 3. Specifically, high-order 16 bits and low-order 16 bits are set respectively to DMARHr and DMARLr. The DMA controller 75 transfers one or more conversion data items obtained by the A/D conversion of ADREQr to an area beginning at an address ARr[31-0] of the memory 3.

The DMA transfer destination address registers DMARHt and DMARLt correspond to the A/D conversion and the DMA transfer by ADREQt. The registers DMARHt and DMARLt are used to set therein a first address to transfer A/D conversion data to the memory 3. Specifically, high-order 16 bits and low-order 16 bits are set respectively to DMARHt and DMARLt. The DMA controller 75 transfers one or more conversion data items obtained by the A/D conversion of ADREQt to an area beginning at an address ARt[31-0] of the memory 3.

The DMA transfer destination address registers DMARHe and DMARLe correspond to the A/D conversion and the DMA transfer by ADREQe. The registers DMARHe and DMARLe are used to set therein a first address to transfer A/D conversion data to the memory 3. Specifically, high-order 16 bits and low-order 16 bits are set respectively to DMARHe and DMARLe. The DMA controller 75 transfers one or more conversion data items obtained by the A/D conversion of ADREQe to an area beginning at an address ARe[31-0] of the memory 3.

Figure 13:
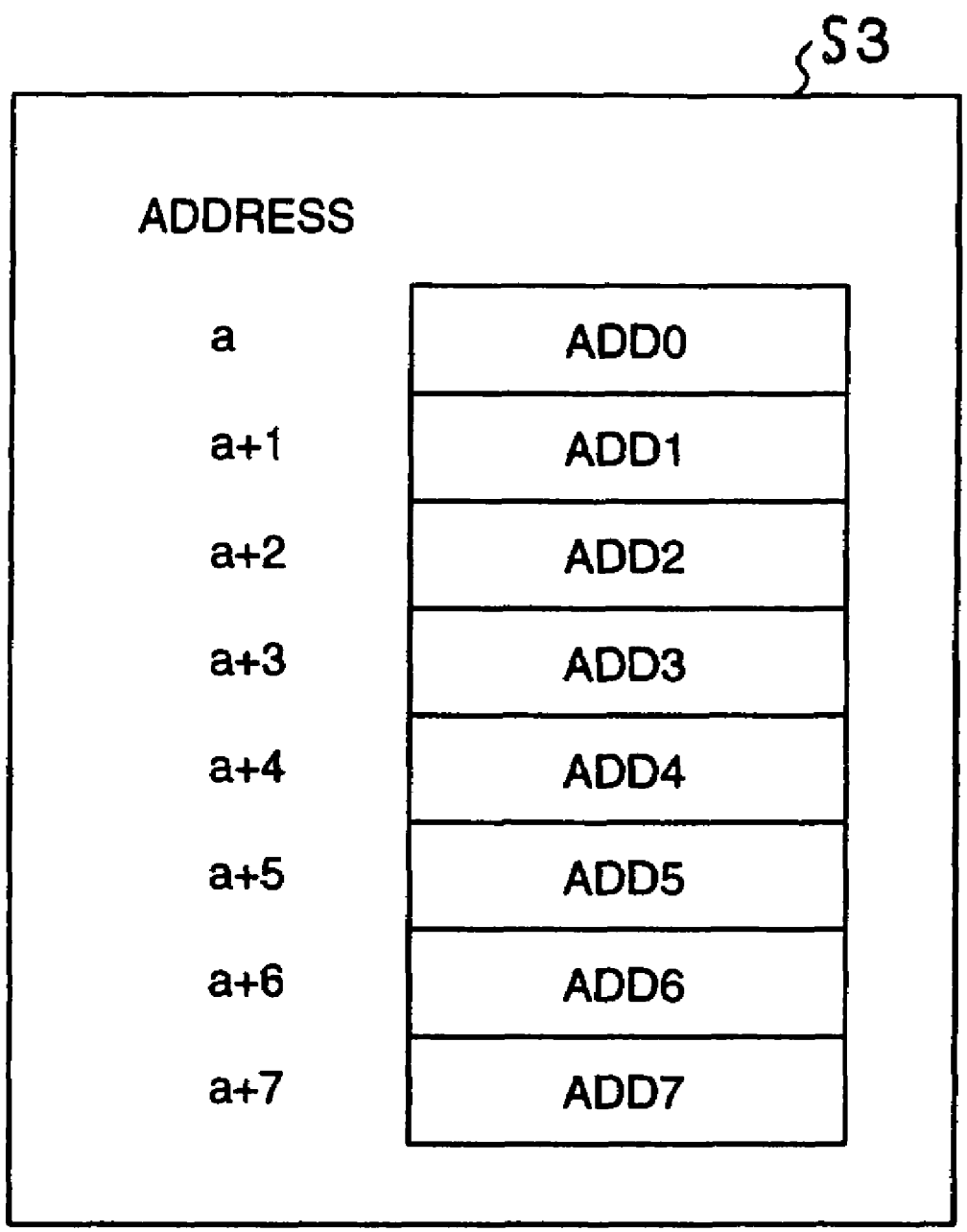
FIG. 13 is a diagram showing a format of a conversion result register.

FIG. 13 shows a format of the conversion result register 53.

The register 53 includes a seven-word storage area including words ADD0 to ADD7. The words respectively correspond to the analog input channels AN0 to AN7. A conversion result of each analog input channel is stored in a conversion result register associated therewith. Assuming that the first address of the register 53 is "a" and the addresses of the words ADD0 to ADD7 are represented as "a", "a+1", "a+2", . . . , "a+7", respectively.

Figure 14:
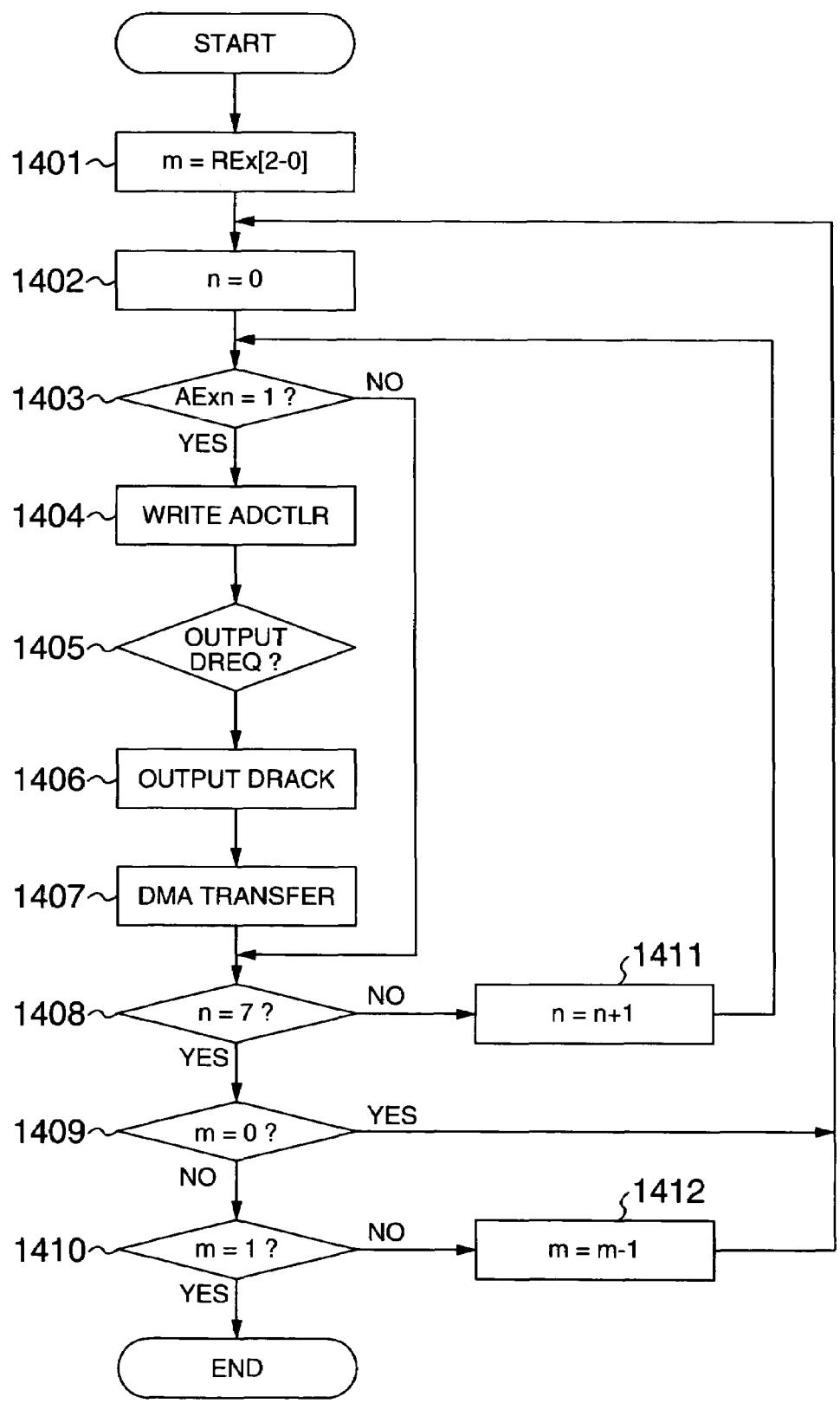
FIG. 14 is a flowchart showing operations of a DMA control circuit to control the initiation of an A/D conversion and a DMA transfer.

FIG. 14 shows operations of the DMA control circuit 75 to control the initiation of an A/D conversion and a DMA transfer in a flowchart.

When an A/D conversion request is received from the request selector 74, the DMA controller 75 reads an associated entry from the A/D conversion table 72 and then controls the initiation of the A/D conversion and the DMA transfer.

First, the controller 75 substitutes the value of RE[2-0] of the entry for variable m (1401) and "0" for variable n (1402).

Next, the controller 75 makes a check to determine whether or not "1" is set to AEn (1403). If this is the case, the controller 75 sets ADST of the A/D conversion control register ADCTLR and an analog input channel number n for AEn to CH[4-0] and then initiates the A/D conversion (1404). The controller 75 enters and stays in a wait state until the A/D conversion controller outputs a DREQ signal (1405).

When the A/D conversion controller outputs a DREQ signal, the DMA controller 75 outputs a DRACK signal (1406) and executes a DMA transfer of a result of the conversion (1407).

In the DMA transfer, an address obtained by adding the first address of the conversion result register 53 to the analog input channel number is set as a word address of a transfer source and an address obtained by adding the value of the DMA transfer address register of the transfer control register 71 to the analog input channel number is set as a word address of a transfer destination. Or, an address obtained by sequentially incrementing the value of the DMA transfer address register of the transfer control register 71 may be set as the word address of the transfer destination.

On the other hand, if one is not set to AEn in step 1403, the control operation is cancelled.

The controller 75 then makes a check to determine whether or not n is seven, namely, the last AE is to be processed (1408). If n is other than seven, the controller 75 adds one to n (1411) to attempt an A/D conversion for the next analog input channel ANn. If n is seven, the controller 75 assumes that the desired A/D conversion has already been finished for the analog inputs AN0 to AN7. The controller 75 makes a check to determine whether or not the A/D conversion is to be again executed.

In the operation, the controller 75 makes a check to determine whether or not variable m is zero (1409). If variable m is zero, namely, RE[2-0] is zero, the controller 75 assumes that the A/D conversion is repeatedly conducted in an infinite fashion and returns to step 1402. If variable m is other than zero, the controller makes a check to determine whether or not the count value specified by RE[2-0] has already been reached (1401). Since one is subtracted from m after the A/D conversion is executed for each of the analog inputs AN0 to AN7, it is possible to determine whether or not variable m is one. If variable m is one, the controller 75 terminates the A/D conversion; otherwise, the controller 75 returns to step 1402.

The control operation can be conducted at a higher speed through a pipeline operation using hardware of circuits such as a logic circuit.

FIG. 15 shows in a signal timing chart an operation example of the DMA transfer device 7 to conduct a DMA transfer of an A/D conversion result. In this chart, the transfer device 7 carries out the A/D conversion for three analog input channels AN1, AN2, and AN3 to transfer conversion results to the memory 3.

"ADCTLR write" indicates a writing operation of the DMA transfer device 7 to write predetermined data in ADCTLR of the conversion control register 51 to initiate an A/D conversion of the A/D converter 5. "A/D conversion" is an A/D conversion of the converter 5 initiated in response to the writing operation in ADCTLR of the DMA transfer device 7.

When an A/D conversion request is issued, the DMA transfer device 7 refers to an entry of the A/D conversion table 72 associated with the request. The DMA transfer device 7 then writes a channel number of the analog input channel AN1 in CH[2-0] of ADCTLR and sets ADREQ of ADCTLR.

When ADREQ of ADCTLR is set, the A/D converter 5 selects the channel AN1 set to CH[2-0] to conduct the A/D conversion. Thereafter, the converter 5 stores a result of the conversion in the conversion result register 53 and outputs DREQ.

When DREQ is outputted, the transfer device 7 outputs DRACK, writes a channel number of the analog input channel AN2 in CH[2-0] of ADCTLR, and sets ADREQ. The device 7 also reads the conversion result of the analog input channel AN1 from the result register 53 to store the result in the transfer buffer 73.

Having executed the operation up to the analog input channel AN3, the transfer device 7 transfers the conversion results of the analog input channel AN1, AN2, and AN3 from the transfer buffer 73 to the memory 3 and then outputs an interruption signal INTD to the CPU 2.

Although the DMA transfer device 7 stores the conversion results of the analog input channels in the transfer buffer 73 and then transfers the results to the memory 3 in the operation, it is also possible that each time the conversion result of each analog input channel is stored in the transfer buffer 73, the result is transferred therefrom to the memory 3.

In the second embodiment, three A/D conversion requests and three entries in the A/D conversion table 72 are used in the operation. However, the number of A/D conversion requests and the number of entries may also be at most two or at least four. Although seven analog input channels are used in the operation, the number of the channels may be at most six and at least eight.

In an A/D conversion table including one or more entries of which each includes enable bits to set whether or not an A/D conversion is executed for the respective analog input channels and a plurality of bits to set the count value or number of executions of the A/D conversion, one entry includes $2^n$ enable bits and the n count number bits, i.e., a total of $2^n+n$ bits. It therefore leads to an advantage that the number of combinations of analog input channels is about n times that of the conventional A/D conversion table using substantially equal storage capacity.

The DMA transfer device includes an A/D conversion table to set therein analog input channels for an A/D conversion. By referring to the table, the A/D conversion of the A/D converter is initiated and a result of the conversion is fed to the memory by a DMA transfer. Therefore, a desired A/D conversion can be conducted using an A/D converter having only fundamental functions without imposing load onto the CPU.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A microcontroller, comprising:
a memory;
an analog-to-digital (A/D) converter comprising a plurality of analog input channels; and
a direct memory access (DMA) transfer device for transferring a result of an A/D conversion from the A/D converter to the memory, wherein:
said DMA transfer device comprises an A/D conversion table for setting an analog input channel for an A/D conversion;
when an A/D conversion is indicated, said DMA transfer device refers to the A/D conversion table to initiate an A/D conversion of the A/D converter; and
when the A/D conversion is finished, said DMA transfer device transfers a result of the conversion from the A/D converter to the memory.

2. A microcontroller according to claim 1, wherein
said A/D converter comprises:
a control register for setting an analog input channel for an A/D conversion; and
a DMA request signal for requesting the DMA transfer device to conduct a DMA transfer;
the DMA transfer device sets the analog input channel to the control register of the A/D converter to thereby initiate an A/D conversion; and
when the A/D converter outputs the DMA request signal after the A/D conversion is finished, said DMA transfer starts a DMA transfer.

* * * * *